United States Patent
Nam et al.

(10) Patent No.: US 10,353,292 B2
(45) Date of Patent: Jul. 16, 2019

(54) POLYMER, ORGANIC LAYER COMPOSITION, AND METHOD OF FORMING PATTERNS

(71) Applicant: SAMSUNG SDI CO., LTD., Yongin-si, Gyeonggi-do (KR)

(72) Inventors: Younhee Nam, Suwon-si (KR); Sunghwan Kim, Suwon-si (KR); Minsoo Kim, Suwon-si (KR); Youjung Park, Suwon-si (KR); Seulgi Jeong, Suwon-si (KR)

(73) Assignee: SAMSUNG SDI CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/355,088

(22) Filed: Nov. 18, 2016

(65) Prior Publication Data

US 2017/0176861 A1    Jun. 22, 2017

(30) Foreign Application Priority Data

Dec. 16, 2015  (KR) .......................... 10-2015-0180372

(51) Int. Cl.
| | | |
|---|---|---|
| *G03F 7/11* | (2006.01) | |
| *G03F 7/20* | (2006.01) | |
| *G03F 7/36* | (2006.01) | |
| *C08G 8/24* | (2006.01) | |
| *H01L 21/3065* | (2006.01) | |
| *C08G 61/10* | (2006.01) | |
| *C08G 61/12* | (2006.01) | |
| *C09D 165/00* | (2006.01) | |
| *G03F 7/16* | (2006.01) | |
| *G03F 7/26* | (2006.01) | |
| *H01L 21/308* | (2006.01) | |
| *C08G 61/02* | (2006.01) | |
| *G03F 7/075* | (2006.01) | |
| *G03F 7/09* | (2006.01) | |
| *C08G 8/04* | (2006.01) | |
| *H01L 21/033* | (2006.01) | |

(52) U.S. Cl.
CPC ................. *G03F 7/11* (2013.01); *C08G 8/04* (2013.01); *C08G 8/24* (2013.01); *C08G 61/02* (2013.01); *C08G 61/10* (2013.01); *C08G 61/12* (2013.01); *C08G 61/124* (2013.01); *C09D 165/00* (2013.01); *G03F 7/0752* (2013.01); *G03F 7/094* (2013.01); *G03F 7/162* (2013.01); *G03F 7/20* (2013.01); *G03F 7/26* (2013.01); *G03F 7/36* (2013.01); *H01L 21/0332* (2013.01); *H01L 21/3081* (2013.01); *H01L 21/3086* (2013.01); *C08G 2261/1422* (2013.01); *C08G 2261/312* (2013.01); *C08G 2261/314* (2013.01); *C08G 2261/3142* (2013.01); *C08G 2261/3241* (2013.01); *C08G 2261/3326* (2013.01); *C08G 2261/344* (2013.01); *C08G 2261/3424* (2013.01); *H01L 21/3065* (2013.01)

(58) Field of Classification Search
CPC . G03F 7/091; G03F 7/094; G03F 7/11; G03F 7/36; C08G 8/24; H01L 21/3065
USPC ...... 430/271.1, 317, 322, 330; 528/153, 155
See application file for complete search history.

(56) References Cited

U.S. PATENT DOCUMENTS

| | | | |
|---|---|---|---|
| 9,263,285 B2 | 2/2016 | Shinjo et al. | |
| 9,665,003 B2 * | 5/2017 | Choi | ........................ G03F 7/091 |
| 2007/0059632 A1 * | 3/2007 | Oguro | .................. C07D 311/82 430/270.1 |
| 2012/0184103 A1 * | 7/2012 | Ogihara | .................. C08G 10/02 438/703 |
| 2014/0363955 A1 * | 12/2014 | Hatakeyama | ......... H01L 21/266 438/514 |
| 2014/0363956 A1 * | 12/2014 | Hatakeyama | ........... G03F 7/094 438/514 |
| 2015/0198883 A1 * | 7/2015 | Hatakeyama | ......... G03F 7/0384 430/286.1 |

FOREIGN PATENT DOCUMENTS

| | | |
|---|---|---|
| CN | 1853141 A | 10/2006 |
| CN | 104253024 A | 12/2014 |
| JP | 5336306 B2 | 11/2013 |
| KR | 10-2004-0095219 A | 11/2004 |
| KR | 10-0819162 B1 | 4/2008 |
| KR | 10-0833212 B1 | 5/2008 |
| KR | 10-0888611 B1 | 3/2009 |
| KR | 10-0908601 B1 | 7/2009 |
| KR | 10-0930673 B1 | 12/2009 |
| KR | 10-0938445 B1 | 1/2010 |

(Continued)

OTHER PUBLICATIONS

Search Report dated Apr. 26, 2017, of the corresponding Taiwanese Patent Application No. 105140310.

(Continued)

*Primary Examiner* — John S Chu
(74) *Attorney, Agent, or Firm* — Lee & Morse, P.C.

(57) ABSTRACT

A polymer, an organic layer composition, and a method of forming patterns, the polymer including a structural unit represented by Chemical Formula 1:

[Chemical Formula 1]

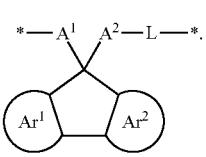

18 Claims, 1 Drawing Sheet

(56) References Cited

FOREIGN PATENT DOCUMENTS

| KR | 10-0950318 B1 | 3/2010 |
|---|---|---|
| KR | 10-1174086 B1 | 8/2012 |
| KR | 10-1225945 B1 | 1/2013 |
| KR | 10-2013-0026912 B2 | 3/2013 |
| KR | 10-2013-0130005 A | 11/2013 |
| KR | 10-1414278 B1 | 7/2014 |
| KR | 10-2014-0127691 A | 11/2014 |
| KR | 10-2015-0131867 B2 | 11/2015 |
| KR | 10-2015-0131916 A | 11/2015 |
| TW | 201144375 A | 12/2011 |
| TW | 201337467 A | 9/2013 |
| WO | WO 2014/030579 A1 | 2/2014 |
| WO | WO 2014/185335 A1 | 11/2014 |

OTHER PUBLICATIONS

Chinese Office Action dated Jul. 3, 2018 (including Search Report), of the corresponding Chinese Patent Application No. 201611079474.5.

* cited by examiner

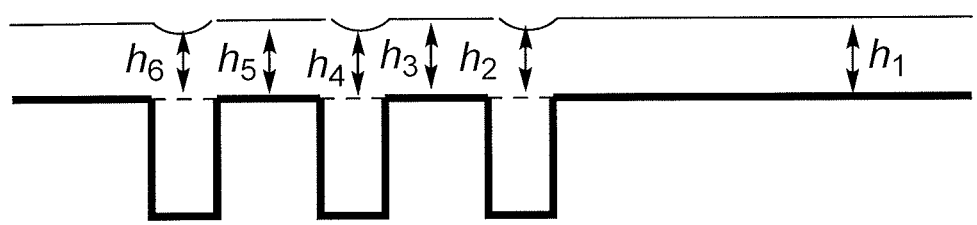
$$\text{Planarization} = h_1 - \left(\frac{h_2+h_3+h_4+h_5+h_6}{5}\right)$$

POLYMER, ORGANIC LAYER COMPOSITION, AND METHOD OF FORMING PATTERNS

CROSS-REFERENCE TO RELATED APPLICATION

Korean Patent Application No. 10-2015-0180372, filed on Dec. 16, 2015, in the Korean Intellectual Property Office, and entitled: "Polymer, Organic Layer Composition, and Method of Forming Patterns," is incorporated by reference herein in its entirety.

BACKGROUND

1. Field

Embodiments relate to a polymer, an organic layer composition including the polymer, and a method of forming patterns using the organic layer composition.

2. Description of the Related Art

Recently, a high integration design in accordance with down-sizing (miniaturization) and complexity of an electronic device has accelerated development of a more advanced material and its related process, and accordingly, lithography using a conventional photoresist also needs new patterning materials and technics. In a patterning process, an organic layer called as a hardmask layer may be formed as a hard interlayer to transfer the fine pattern of the photoresist down to a sufficient depth on a substrate without its collapse.

SUMMARY

Embodiments are directed to a polymer, an organic layer composition including the polymer, and a method of forming patterns using the organic layer composition.

The embodiments may be realized by providing a polymer comprising a structural unit represented by Chemical Formula 1:

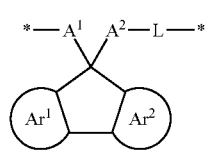

[Chemical Formula 1]

wherein, in Chemical Formula 1, $Ar^1$ and $Ar^2$ are each independently a substituted or unsubstituted benzene ring or an aromatic ring including two to four fused substituted or unsubstituted benzene rings, $A^1$ and $A^2$ are each independently a substituted or unsubstituted aromatic ring, provided that at least one of $A^1$ and $A^2$ is substituted with a hydrogen-bondable functional group, and a sum of a number of the hydrogen-bondable functional group of $A^1$ and a number of the hydrogen-bondable functional group of $A^2$ is greater than or equal to 3, L is a divalent organic group, and * is a linking point.

The hydrogen-bondable functional group may be a hydroxy group, an amine group, or a combination thereof.

$A^1$ and $A^2$ may each independently include a substituted or unsubstituted one of the following moieties:

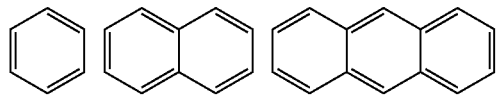

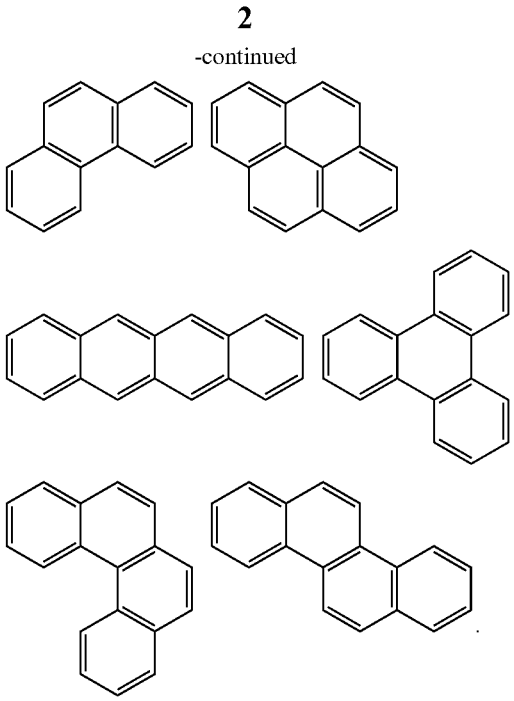

L may be represented by one of Chemical Formulae Z1 to Z4:

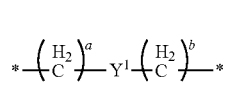

[Chemical Formula Z1]

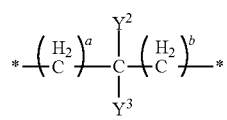

[Chemical Formula Z2]

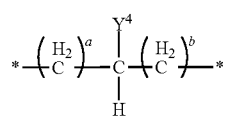

[Chemical Formula Z3]

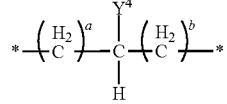

[Chemical Formula Z4]

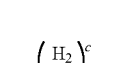

wherein, in Chemical Formulae Z1 to Z4, a and b are each independently 0 or 1, c is an integer of 1 to 5, * is a linking point, and $Y^1$ to $Y^4$ each independently include a substituted or unsubstituted one of the following moieties:

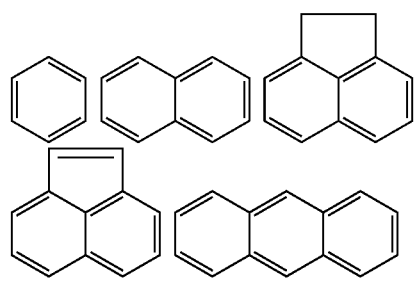

-continued

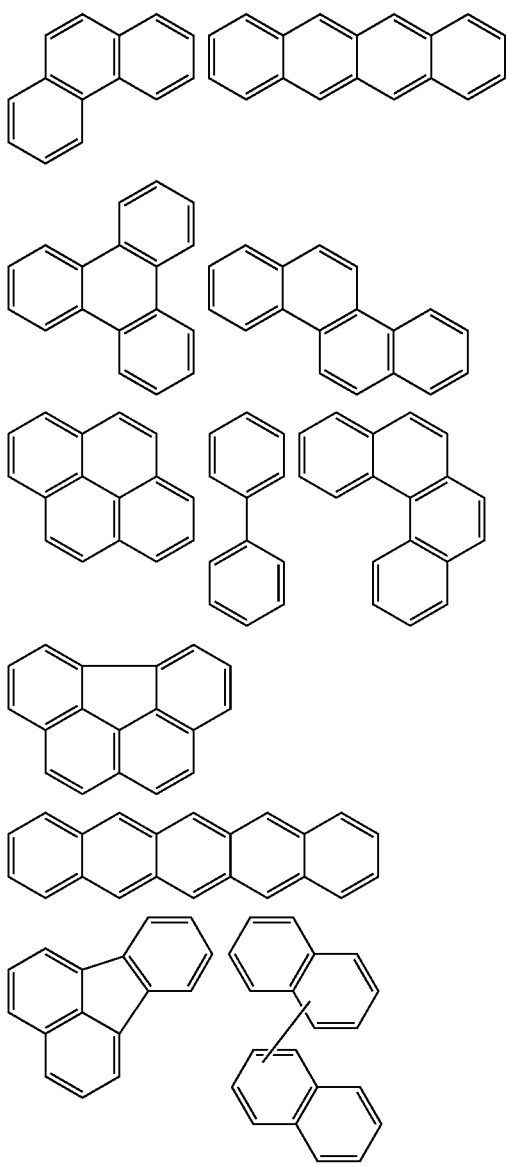

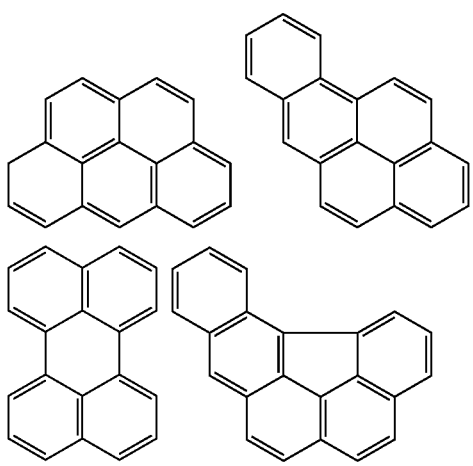

-continued

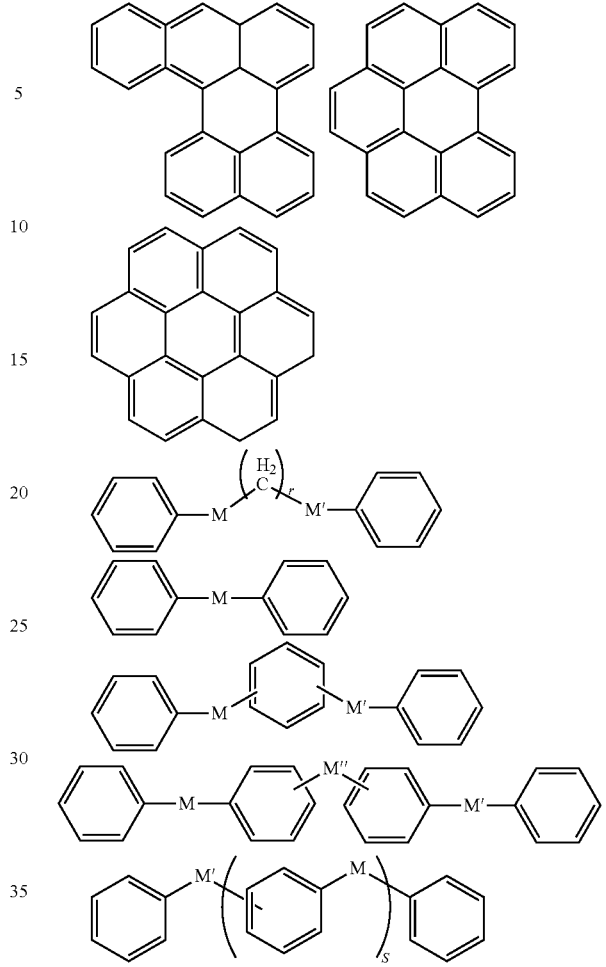

wherein, in the above moieties, M, M', and M" are each independently a substituted or unsubstituted C1 to C10 alkylene group, O, S, $SO_2$, $CR^aR^b$, $NR^d$, or carbonyl, in which $R^a$, $R^b$, and $R^d$ are each independently hydrogen, a substituted or unsubstituted C1 to C10 alkyl group, a substituted or unsubstituted C6 to C30 aryl group, a halogen atom, a halogen-containing group, or a combination thereof, r is an integer of 0 to 10, and s is an integer of 3 to 10.

The sum of the number of the hydrogen-bondable functional group of $A^1$ and the number of the hydrogen-bondable functional group of $A^2$ may be 3, 4, 5, or 6.

The structural unit represented by Chemical Formula 1 may be represented by one of Chemical Formulae 1-1 and 1-2:

[Chemical Formula 1-1]

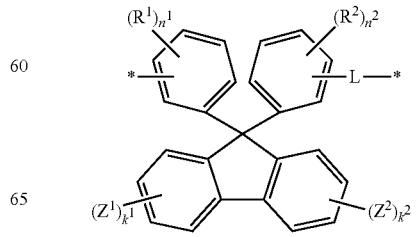

-continued

[Chemical Formula 1-2]

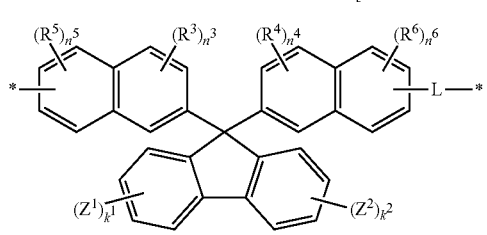

wherein, in Chemical Formulae 1-1 and 1-2, $R^1$ to $R^6$ are each independently a hydroxy group, an amine group, or a combination thereof, $n^1$ to $n^6$ are each independently an integer of 0 to 3, a sum of $n^1$ and $n^2$ and a sum of $n^3$ to $n^6$ each independently being greater than or equal to 3, $Z^1$ and $Z^2$ are each independently a hydroxy group, a methoxy group, an ethoxy group, a halogen, a substituted or unsubstituted C1 to C30 alkyl group, a substituted or unsubstituted C6 to C30 aryl group, a substituted or unsubstituted C1 to C30 alkoxy group, or a combination thereof, $k^1$ and $k^2$ are independently an integer of 0 to 4, L is a divalent organic group, and * is a linking point.

The polymer may further include a structural unit represented by Chemical Formula 2:

*-X-L-* [Chemical Formula 2]

wherein, in Chemical Formula 2, X is an aromatic ring group substituted with at least one hydrogen-bondable functional group or a heteroaromatic ring group substituted with at least one hydrogen-bondable functional group, L is a divalent organic group, and * is a linking point.

The hydrogen-bondable functional group of X may be a hydroxy group, an amine group, or a combination thereof.

The polymer may have a weight average molecular weight of about 500 to about 200,000.

The embodiments may be realized by providing an organic layer composition including a solvent; and a polymer including a structural unit represented by Chemical Formula 1,

[Chemical Formula 1]

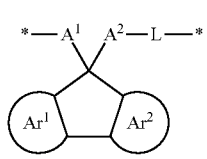

wherein, in Chemical Formula 1, $Ar^1$ and $Ar^2$ are each independently a substituted or unsubstituted benzene ring or an aromatic ring including two to four fused substituted or unsubstituted benzene rings, $A^1$ and $A^2$ are each independently a substituted or unsubstituted aromatic ring, provided that at least one of $A^1$ and $A^2$ is substituted with a hydrogen-bondable functional group, and a sum of a number of the hydrogen-bondable functional group of $A^1$ and a number of the hydrogen-bondable functional group of $A^2$ is greater than or equal to 3, L is a divalent organic group, and * is a linking point.

The hydrogen-bondable functional group may be a hydroxy group, an amine group, or a combination thereof.

$A^1$ and $A^2$ may each independently include a substituted or unsubstituted one of the following moieties:

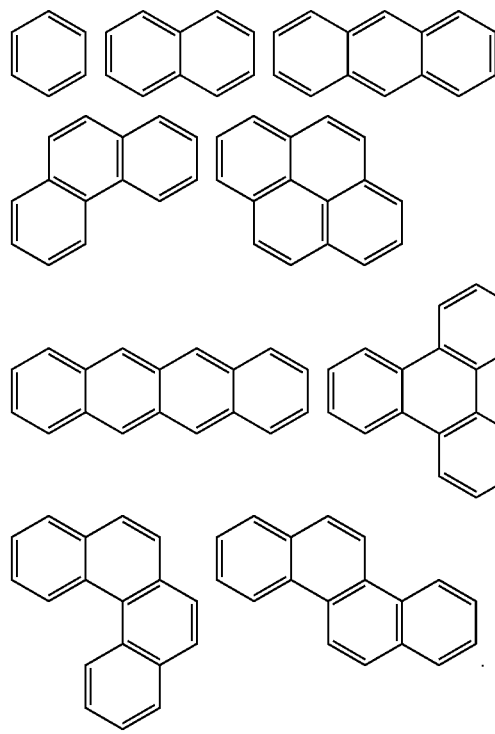

L may be represented by one of Chemical Formulae Z1 to Z4:

[Chemical Formula Z1]

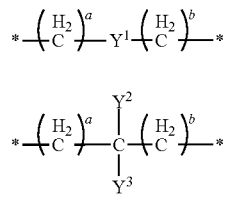

[Chemical Formula Z2]

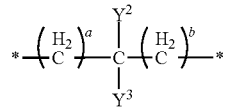

[Chemical Formula Z3]

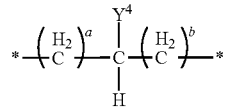

[Chemical Formula Z4]

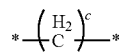

wherein, in Chemical Formulae Z1 to Z4, a and b are each independently 0 or 1, c is an integer of 1 to 5, * is a linking point, and $Y^1$ to $Y^4$ each independently include a substituted or unsubstituted one of the following moieties:

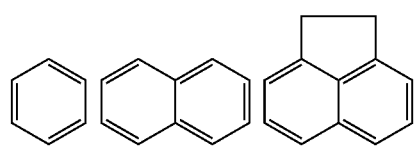

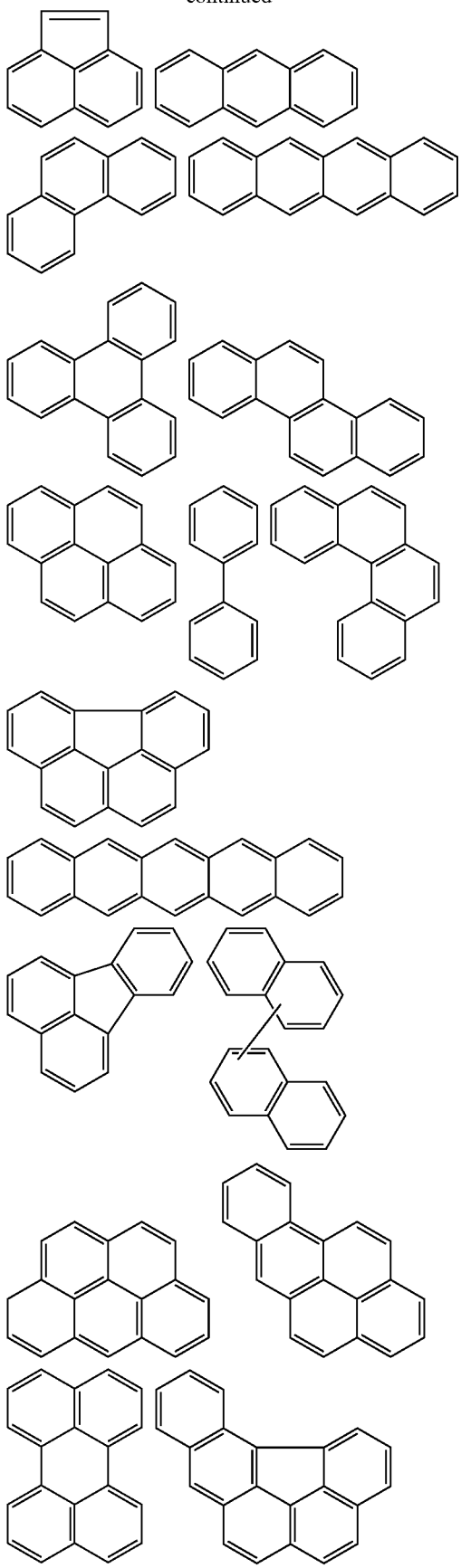
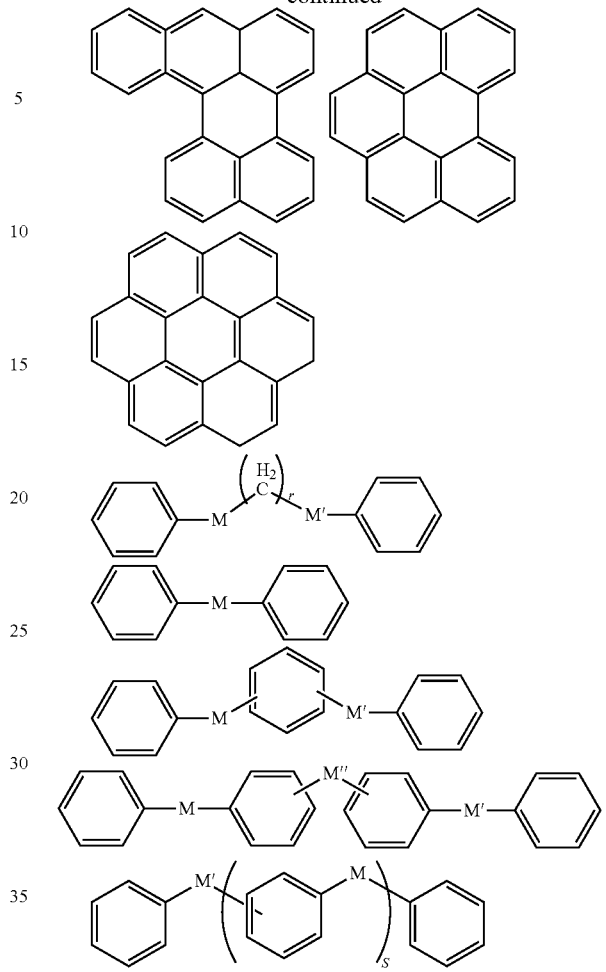

wherein, in the above moieties, M, M', and M" are each independently a substituted or unsubstituted C1 to C10 alkylene group, O, S, $SO_2$, $CR^aR^b$, $NR^d$, or carbonyl, in which $R^a$, $R^b$, and $R^d$ are each independently hydrogen, a substituted or unsubstituted C1 to C10 alkyl group, a substituted or unsubstituted C6 to C30 aryl group, a halogen atom, a halogen-containing group, or a combination thereof, r is an integer of 0 to 10, and s is an integer of 3 to 10.

The sum of the number of the hydrogen-bondable functional group of $A^1$ and the number of the hydrogen-bondable functional group of $A^2$ may be 3, 4, 5, or 6.

The structural unit represented by Chemical Formula 1 may be represented by one of Chemical Formulae 1-1 and 1-2:

[Chemical Formula 1-1]

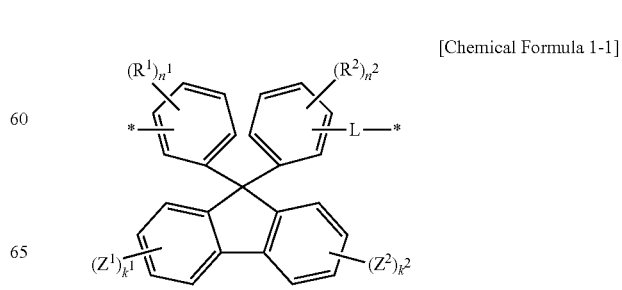

-continued

[Chemical Formula 1-2]

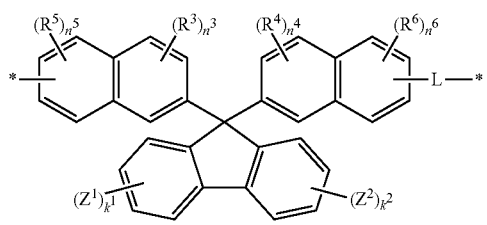

wherein, in Chemical Formulae 1-1 and 1-2, $R^1$ to $R^6$ are independently a hydroxy group, an amine group, or a combination thereof, $n^1$ to $n^6$ are independently an integer of 0 to 3, a sum of $n^1$ and $n^2$ and a sum of $n^3$ to $n^6$ each independently being greater than or equal to 3, $Z^1$ and $Z^2$ are independently hydroxy group, methoxy group, ethoxy group, a halogen, a substituted or unsubstituted C1 to C30 alkyl group, a substituted or unsubstituted C6 to C30 aryl group, a substituted or unsubstituted C1 to C30 alkoxy group, or a combination thereof, $k^1$ and $k^2$ are independently an integer of 0 to 4, L is a divalent organic group, and * is a linking point.

The polymer may further include a structural unit represented by Chemical Formula 2.

*-X-L-*      [Chemical Formula 2]

wherein, in Chemical Formula 2, X is an aromatic ring group substituted with at least one hydrogen-bondable functional group or a heteroaromatic ring group substituted with at least one hydrogen-bondable functional group, L is a divalent organic group, and * is a linking point.

The hydrogen-bondable functional group of X may be a hydroxy group, an amine group, or combination thereof.

The polymer may have a weight average molecular weight of about 500 to about 200,000.

The embodiments may be realized by providing a method of forming patterns, the method including providing a material layer on a substrate, applying the organic layer composition according to an embodiment on the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

Applying the organic layer composition may include performing a spin-on coating method.

BRIEF DESCRIPTION OF THE DRAWING

Features will be apparent to those of skill in the art by describing in detail exemplary embodiments with reference to the attached drawings in which:

FIG. 1 illustrates a reference view for explaining Calculation Equation 1 to evaluate planarization characteristics.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of hydrogen of a compound.

As used herein, when a definition is not otherwise provided, the term 'hetero' refers to one including 1 to 3 heteroatoms selected from N, O, S, and P.

Hereinafter, a polymer according to an embodiment is described.

A polymer according to an embodiment may include a structural unit represented by Chemical Formula 1.

[Chemical Formula 1]

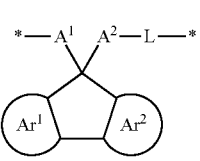

In Chemical Formula 1, $Ar^1$ and $Ar^2$ may each independently be or include, e.g., a substituted or unsubstituted benzene ring or an aromatic ring including two to four fused substituted or unsubstituted benzene rings.

$A^1$ and $A^2$ may each independently be or include, e.g., a substituted or unsubstituted aromatic ring. In an implementation, at least one of $A^1$ and $A^2$ may be substituted with or include a hydrogen-bondable functional group. In an implementation, a sum of a number of the hydrogen-bondable functional groups of $A^1$ and a number of the hydrogen-bondable functional groups of $A^2$ may be greater than or equal to 3.

L may be, e.g., a divalent organic group. For example, L may be a linking group that is di- or higher valent such that L may be bonded to $A^2$ and another atom, and may also optionally be further substituted or bonded to other atoms, groups, moieties, etc.

* is a linking point.

The polymer may include aromatic ring moieties represented by $Ar^1$, $Ar^2$, $A^1$, and $A^2$, an alkylene group, and a linker moiety represented by L in a structural unit.

For example, the polymer may include the aromatic ring moieties represented by $Ar^1$, $Ar^2$, $A^1$, and $A^2$ and may exhibit excellent etch resistance.

In Chemical Formula 1, the $Ar^1$ and $Ar^2$ may be or may include aromatic rings, e.g., independently substituted or unsubstituted benzene rings or independently two to four fused substituted or unsubstituted benzene rings.

For example, the $Ar^1$ and $Ar^2$ may be represented by one of the following Chemical Formulae A to D.

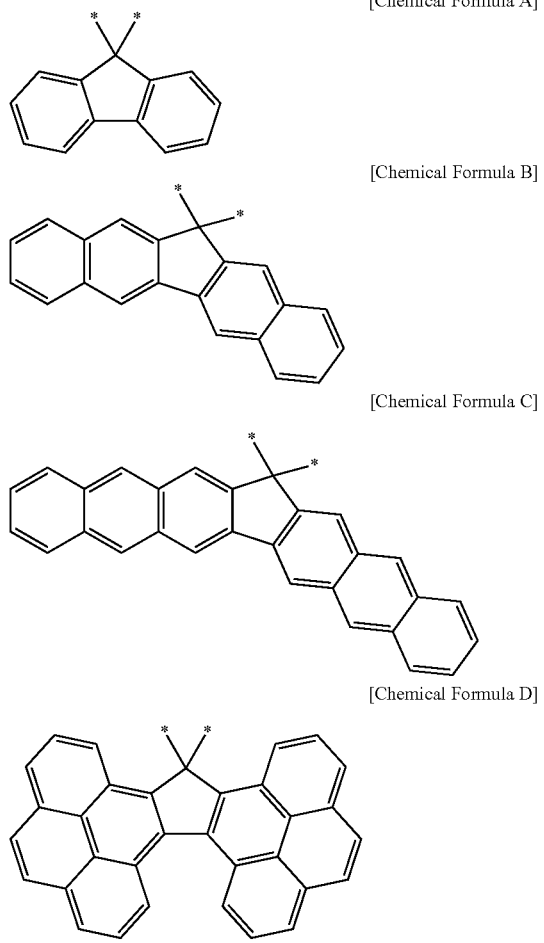

[Chemical Formula A]

[Chemical Formula B]

[Chemical Formula C]

[Chemical Formula D]

Chemical Formulae A to D are shown by cutting a point where the $Ar^1$ and $Ar^2$ are connected with $A^1$ and $A^2$ in Chemical Formula 1. In Chemical Formulae A to D, the aromatic rings may be unsubstituted or may be substituted with, e.g., a substituent of a hydroxy group, a methoxy group, an ethoxy group, a halogen, a substituted or unsubstituted C1 to C30 alkyl group, a substituted or unsubstituted C6 to C30 aryl group, or a substituted or unsubstituted C1 to C30 alkoxy group. In an implementation, the $Ar^1$ and $Ar^2$ in Chemical Formula 1 may be various fused ring groups other than the fused rings included in Chemical Formulae B to D.

For example, the polymer may include a fluorene backbone in the structural unit and may exhibit heat resistance as well as etch resistance.

In an implementation, in Chemical Formula 1, $A^1$ and $A^2$ represent a substituted or unsubstituted aromatic ring, and may include one of the following moieties.

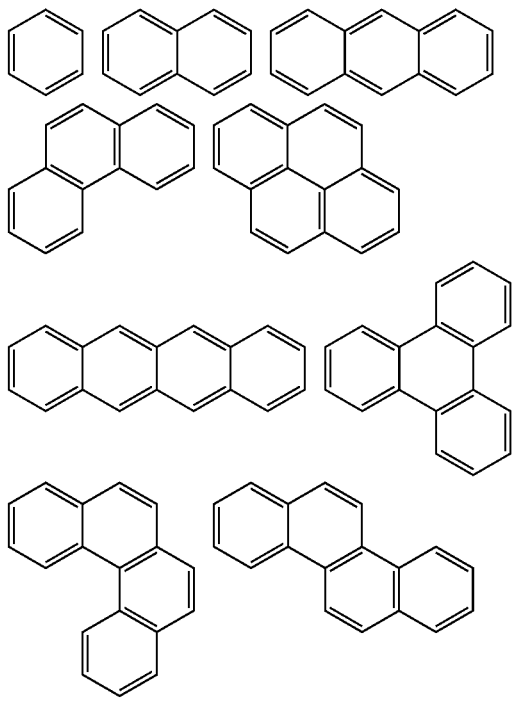

Linking points of ring groups of the above moieties in a structural unit represented by Chemical Formula 1 may be at any suitable position. In an implementation, any hydrogen in the ring groups of the above moieties may be replaced by a substituent.

At least one of $A^1$ and $A^2$ may be substituted with a hydrogen-bondable functional group, and the sum of the number of the hydrogen-bondable functional groups in $A^1$ and the number of the hydrogen-bondable functional groups in $A^2$ may be greater than or equal to 3.

Herein, the hydrogen-bondable functional group refers to groups reacting with other groups and forming a hydrogen bond. In an implementation, the hydrogen-bondable functional group may include, e.g., a hydroxy group or an amine group.

The polymer may include greater than or equal to about 3 hydrogen-bondable functional groups in the $A^1$ and $A^2$ of the structural unit, which may help improve solubility in a solvent. In addition, when the polymer is used as an organic layer material, adherence of an organic layer to a lower layer may be improved, and thus excellent gap-fill characteristics and planarization characteristics may be secured.

In an implementation, in Chemical Formula 1, the sum of the number of the hydrogen-bondable functional groups in $A^1$ and the number of the hydrogen-bondable functional groups in $A^2$ may be greater than or equal to 3 and less than or equal to 6, and each number of the hydrogen-bondable functional group substituted in $A^1$ and the hydrogen-bondable functional group substituted in $A^2$ may be controlled.

In an implementation, in Chemical Formula 1, L may be a divalent organic group, and may be, e.g., represented by one of Chemical Formulae Z1 to Z4.

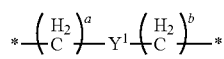
[Chemical Formula Z1]
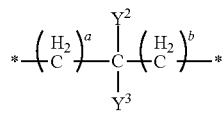
[Chemical Formula Z2]
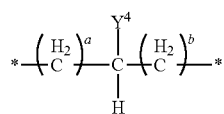
[Chemical Formula Z3]
[Chemical Formula Z4]
In Chemical Formulae Z1 to Z4,
a and b may each independently be, e.g., 0 or 1,
c may be, e.g., an integer of 1 to 5,
* is a linking point,
$Y^1$ to $Y^4$ may each independently be or include, e.g., a substituted or unsubstituted one of the following moieties.
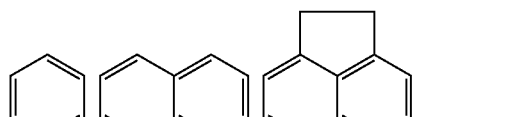
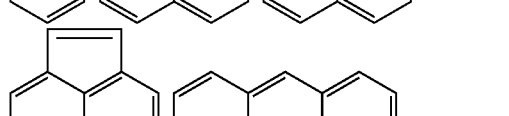
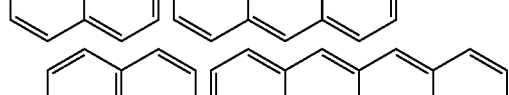
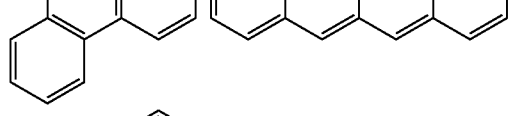
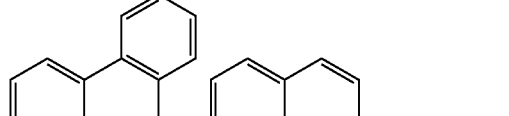
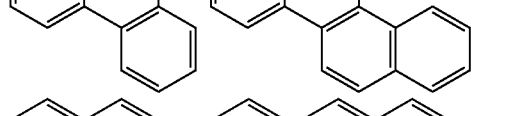
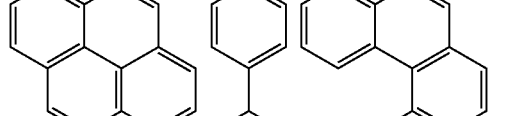
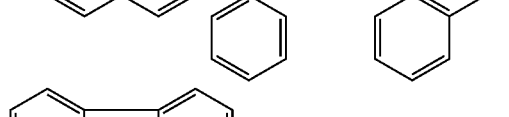
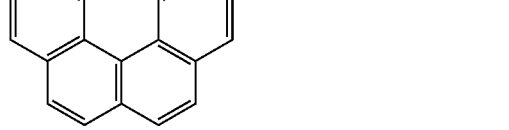
-continued
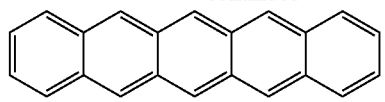
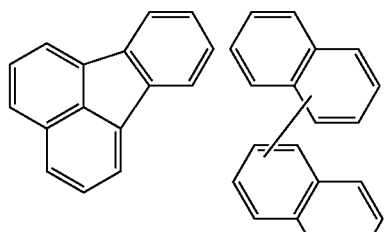
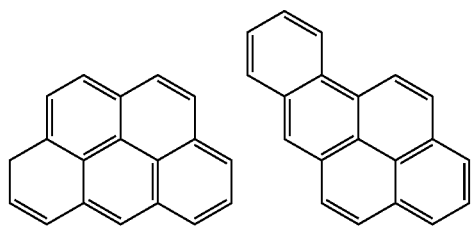
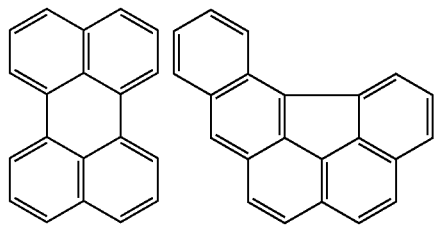
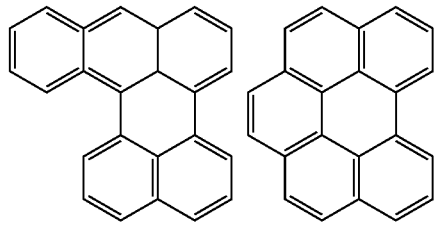
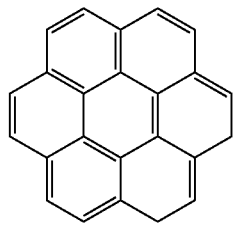
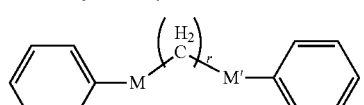
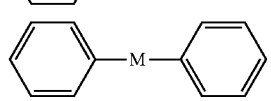
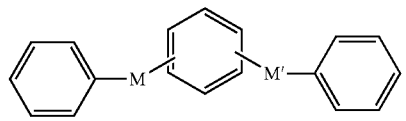
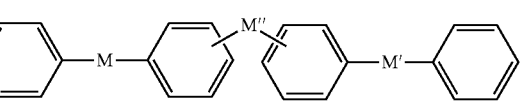

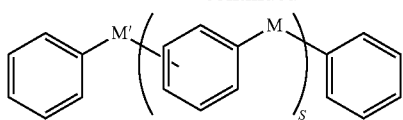

In the above moieties, M, M', and M" may each independently be or include, e.g., a substituted or unsubstituted C1 to C10 alkylene group, O, S, $SO_2$, $CR^aR^b$, $NR^d$, or carbonyl. $R^a$, $R^b$, and $R^d$ may each independently be or include, e.g., hydrogen, a substituted or unsubstituted C1 to C10 alkyl group, a substituted or unsubstituted C6 to C30 aryl group, a halogen atom, a halogen-containing group, or a combination thereof.

r may be, e.g., an integer of 0 to 10, and s may be, e.g., an integer of 3 to 10.

In an implementation, $Y^1$ to $Y^4$ may each independently include, e.g., a substituted or unsubstituted one of the following moieties, in which M is a substituted or unsubstituted C1 to C10 alkylene group, O, S, $SO_2$, $CR^aR^b$, $NR^d$, or carbonyl, and in which $R^a$, $R^b$, and $R^d$ are each independently hydrogen, a substituted or unsubstituted C1 to C10 alkyl group, a substituted or unsubstituted C6 to C30 aryl group, a halogen atom, a halogen-containing group, or a combination thereof.

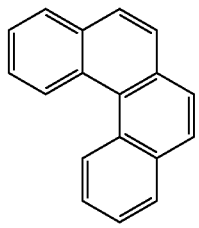
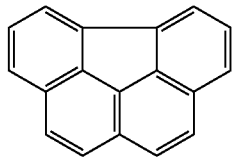
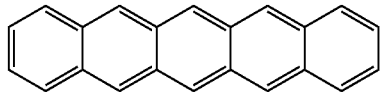
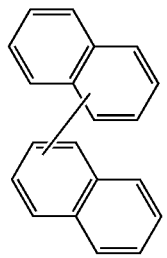
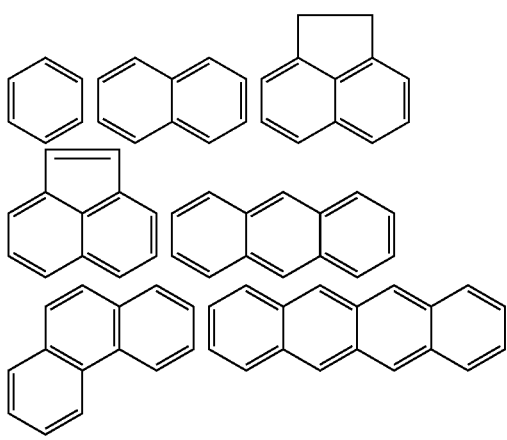
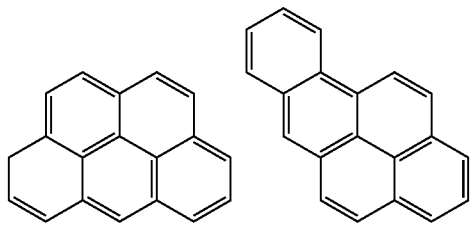
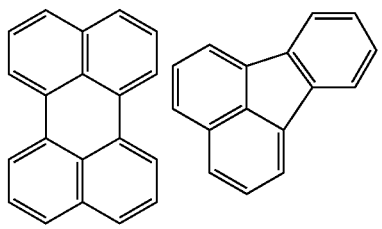
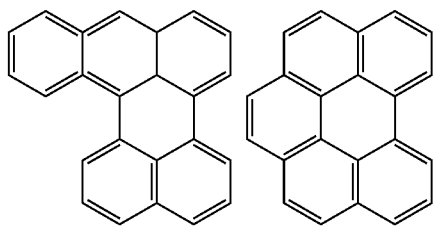
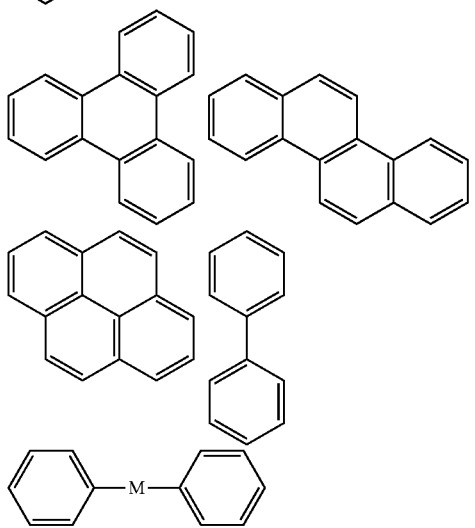
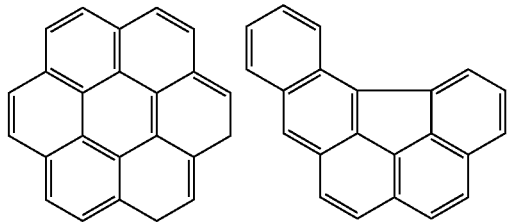

Linking points where ring groups of the above moieties in the structure of Chemical Formula 2 may be any two suitable linking points. In an implementation, hydrogen in the ring groups of the above moieties may be substituted by a substituent.

The linking group may be included in a compound included in a hardmask composition according to an embodiment and may help increase flexibility of the polymer. This flexible structure may help lower a glass transition temperature (Tg) and thus may help increase a reflow during a baking process as well as increases free volume of the polymer and improve solubility and thus may help improve gap-fill performance and planarization.

In an implementation, the polymer may include a plurality of moieties represented by Chemical Formula 1, and the plurality of moieties may have the same structure or different structures.

In an implementation, a structural unit represented by Chemical Formula 1 may be represented by, e.g., one of Chemical Formulae 1-1 and 1-2.

[Chemical Formula 1-1]

[Chemical Formula 1-2]

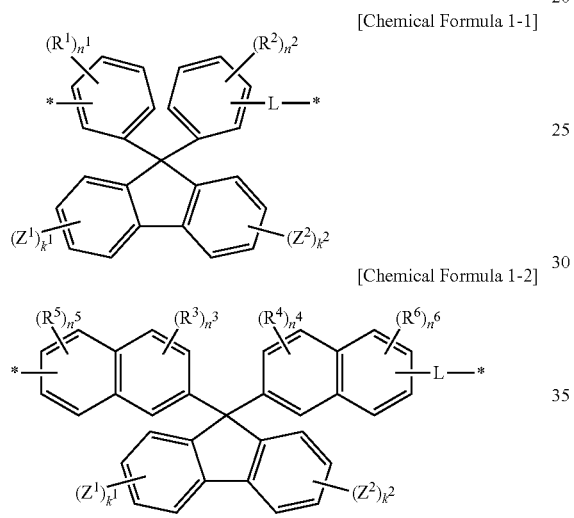

In Chemical Formulae 1-1 and 1-2, $R^1$ to $R^6$ may each independently be, e.g., a hydroxy group, an amine, or a combination thereof.

$n^1$ to $n^6$ may each independently be, e.g., an integer of 0 to 3. A sum of $n^1$ and $n^2$ and a sum of $n^3$ to $n^6$ may each independently be, e.g., greater than or equal to 3.

$Z^1$ and $Z^2$ may each independently be or include, e.g., a hydroxy group, a methoxy group, an ethoxy group, a halogen, a substituted or unsubstituted C1 to C30 alkyl group, a substituted or unsubstituted C6 to C30 aryl group, a substituted or unsubstituted C1 to C30 alkoxy group, or a combination thereof.

$k^1$ and $k^2$ may each independently be, e.g., an integer of 0 to 4,

L may be, e.g., a divalent organic group, and

* is a linking point.

In an implementation, the polymer may further include, e.g., a structural unit represented by Chemical Formula 2.

-X-L- [Chemical Formula 2]

In Chemical Formula 2, X may be, e.g., an aromatic ring substituted with at least one hydrogen-bondable functional group or a heteroaromatic ring group substituted with at least one hydrogen-bondable functional group.

L may be, e.g., a divalent organic group, and

* is a linking point.

In Chemical Formula 2, the hydrogen-bondable functional group and a divalent organic group represented by L may be the same as described above. In an implementation, the aromatic ring group may be, e.g., a substituted or unsubstituted one of the following moieties.

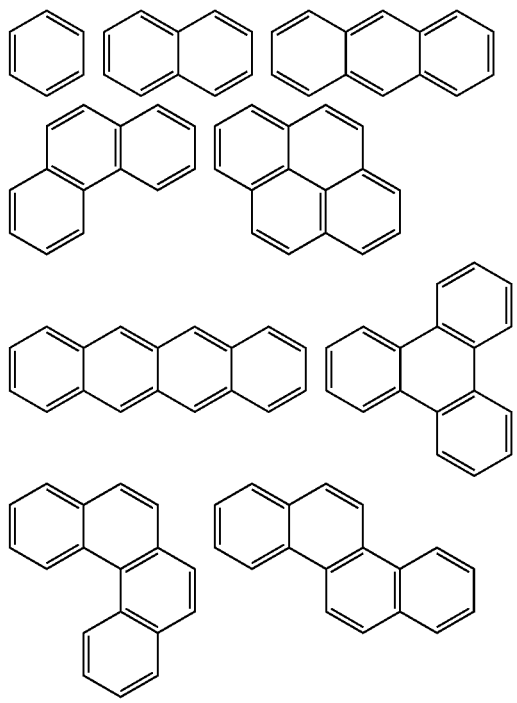

In an implementation, in Chemical Formula 2, X may be, e.g., an aromatic ring-containing group substituted with greater than or equal to about 2 hydroxy groups or a heteroaromatic ring-containing group substituted with greater than or equal to about 2 hydroxy groups.

In an implementation, the polymer may include a plurality of moieties represented by Chemical Formula 2, and the plurality of moieties may have the same structure or different structures.

In an implementation, the polymer may have a weight average molecular weight of, e.g., about 500 to about 200,000. When the polymer has a weight average molecular weight within the range, an organic layer composition (e.g., a hardmask composition) including the polymer may be optimized by adjusting the amount of carbon and solubility in a solvent.

When the polymer is used as an organic layer material, excellent gap-fill and planarization characteristics may not only be provided when a step is present in a lower substrate (or a film) or when a pattern is formed, but a uniform thin film may also be formed without forming a pin-hole and a void during the baking or deteriorating a thickness distribution.

According to another embodiment, an organic layer composition including the polymer and a solvent is provided.

The solvent may be a suitable solvent having sufficient solubility or dispersibility for the polymer and may include, e.g., propylene glycol, propylene glycol diacetate, methoxy propanediol, diethylene glycol, diethylene glycol butylether, tri(ethyleneglycol)monomethylether, propylene glycol monomethylether, propylene glycol monomethylether acetate, cyclohexanone, ethyllactate, gamma-butyrolactone, methylpyrrolidone, acetylacetone, or ethyl 3-ethoxypropionate.

The polymer may be included in an amount of about 1 wt % to about 50 wt % based on the total amount of the organic layer composition. When the polymer is included in the range, a thickness, surface roughness, and planarization of the organic layer may be controlled.

In an implementation, the organic layer composition may further include an additive of a surfactant, a cross-linking agent, a thermal acid generator, a plasticizer, and the like.

The surfactant may include, e.g., alkylbenzene sulfonate salt, alkyl pyridinium salt, polyethylene glycol, or a quaternary ammonium salt.

The cross-linking agent may include, e.g., a melamine-based agent, a substituted urea-based agent, or a polymer-based agent. In an embodiment, a cross-linking agent having at least two cross-linking forming substituent may include, e.g., a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or butoxymethylated thiourea, or the like.

The cross-linking agent may be a cross-linking agent having high heat resistance. The cross-linking agent having high heat resistance nay be a compound including a cross-linking substituent including an aromatic ring (for example a benzene ring, or a naphthalene ring) in the molecule.

The thermal acid generator may include, e.g., an acidic compound such as p-toluenesulfonic acid, trifluoromethanesulfonic acid, pyridiniump-toluenesulfonic acid, salicylic acid, sulfosalicylic acid, citric acid, benzoic acid, hydroxybenzoic acid, naphthalenecarbonic acid and the like or/and 2,4,4,6-tetrabromocyclohexadienone, benzointosylate, 2-nitrobenzyltosylate, other organosulfonic acid alkylester, or the like.

The additive may be present in an amount of about 0.001 to 75 parts by weight based on 100 parts by weight of the organic layer composition.

According to another embodiment, an organic layer manufactured using the organic layer composition may be provided. The organic layer may be, e.g., formed by coating the organic layer composition on a substrate and heat-treating it for curing and may include, e.g., a hardmask layer, a planarization layer, a sacrificial layer, a filler, and the like for an electronic device.

Hereafter, a method for forming patterns by using the organic layer composition is described.

A method of forming patterns according to one embodiment may include providing a material layer on a substrate, applying the organic layer composition including the polymer and the solvent, heat-treating the organic layer composition including the monomer and the solvent to form a hardmask layer, forming a silicon-containing thin layer on the hardmask layer, forming a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The substrate may be, e.g., a silicon wafer, a glass substrate, or a polymer substrate.

The material layer is a material to be finally patterned, e.g. a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above, and may be applied by spin-on coating in a form of a solution. In an implementation, a thickness of the organic layer composition may be, e.g., about 50 Å to about 100,000 Å.

The heat-treating of the organic layer composition may be performed, e.g., at about 100 to about 500° C. for about 10 seconds to about 1 hour.

The silicon-containing thin layer may be formed of, e.g., SiCN, SiOC, SiON, SiOCN, SiC, SiO, and/or SiN.

The method may further include forming a bottom anti-reflective coating (BARC) before forming the photoresist layer on the silicon-containing thin layer.

Exposure of the photoresist layer may be performed using, for example ArF, KrF, or EUV. After exposure, heat treatment may be performed at about 100° C. to about 500° C.

The etching process of the exposed part of the material layer may be performed through a dry etching process using an etching gas and the etching gas may be, e.g., $CHF_3$, $CF_4$, $Cl_2$, $BCl_3$, or a mixed gas thereof.

The etched material layer may be formed in a plurality of pattern, and the plurality of pattern may be a metal pattern, a semiconductor pattern, an insulation pattern, and the like, e.g., diverse patterns of a semiconductor integrated circuit device.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

SYNTHESIS EXAMPLE

Synthesis Example 1

38 g of 4,4'-(9H-fluorene-9,9-diyl)dibenzene-1,2-diol, 17 g of 1,4-bis(methoxymethyl)benzene, 82 g of propylene glycol monomethyl ether acetate (PGMEA), and 0.5 g of diethylsulfate were put in a flask and stirred at 100° C. to perform a polymerization reaction. When a weight average molecular weight reached 2,000 to 3,500, the reaction was terminated. When the polymerization reaction was complete, the reactant was slowly cooled down to ambient temperature and then, added to 40 g of distilled water and 400 g of methanol, and the mixture was strongly stirred an allowed to stand. After removing a supernatant therefrom, a precipitate was dissolved in 80 g of propylene glycol monomethyl ether acetate (PGMEA), and the solution was strongly stirred by using 320 g of methanol and 320 g of water and then, allowed to stand (primary). Herein, after removing a supernatant obtained therefrom, a precipitate was dissolved in 80 g of propylene glycol monomethyl ether acetate (PGMEA) (secondary). The primary and secondary processes were regarded as one purification process, which was performed a total of three times. The purified polymer was dissolved in 80 g of propylene glycol monomethyl ether acetate (PGMEA), and the methanol and the distilled water remaining in the solution were removed under a reduced pressure to obtain a polymer including a structural unit represented by Chemical Formula 1a (Mw: 3,500).

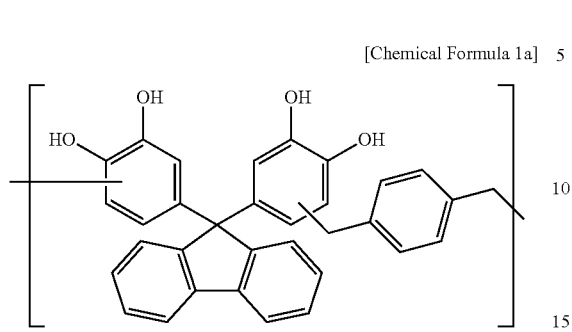

[Chemical Formula 1a]

Synthesis Example 2

A polymer including a structural unit represented by Chemical Formula 1b (Mw: 3,500) was obtained through the same synthesis as Synthesis Example 1 by using 48 g of 6,6'-(9H-fluorene-9,9-diyl)dinaphthalene-1,2-diol, 17 g of 1,3-bis(methoxymethyl)benzene, 98 g of propylene glycol monomethyl ether acetate (PGMEA), and 0.5 g of diethylsulfate.

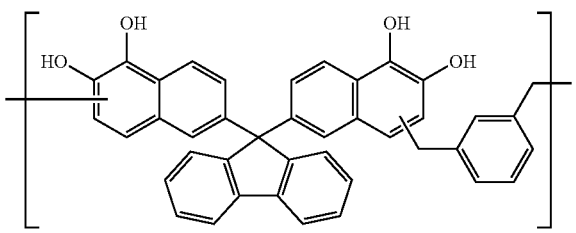

[Chemical Formula 1b]

Synthesis Example 3

A polymer including a structural unit represented by Chemical Formula 1c (Mw: 3,200) was obtained through the same synthesis as Synthesis Example 1 by using 23 g of pyrene-1,6-diol, 34 g of 1,4-bis(methoxymethyl)benzene, 38 g of 4,4'-(9H-fluorene-9,9-diyl)dibenzene-1,2-diol, 143 g of propylene glycol monomethyl ether acetate (PGMEA), and 0.7 g of diethylsulfate.

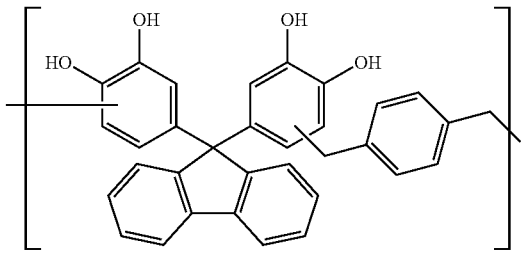

[Chemical Formula 1c]

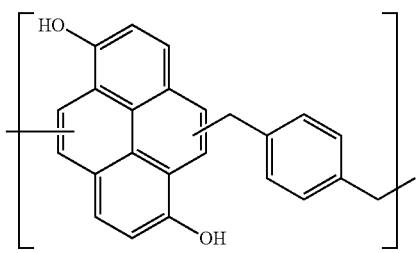

Synthesis Example 4

A polymer including a structural unit represented by Chemical Formula 1d (Mw: 3,500) was obtained through the same synthesis as Synthesis Example 1 by using 38 g of 4,4'-(9H-fluorene-9,9-diyl)dibenzene-1,2-diol, 47 g of 4,4'-(propane-2,2-diyl)bis((4-(methoxymethyl)phenoxy)benzene), 128 g of propylene glycol monomethyl ether acetate (PGMEA), and 0.5 g of diethylsulfate.

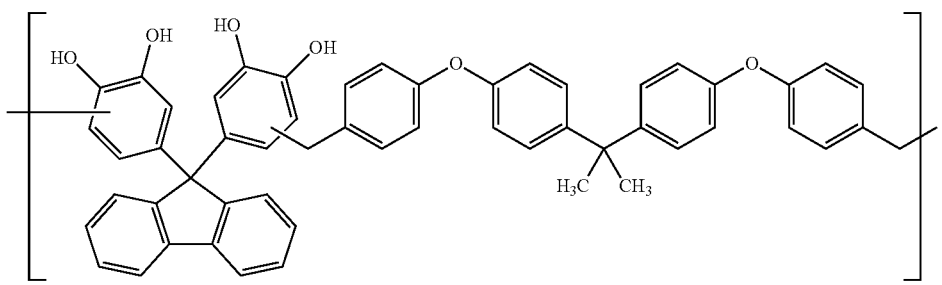

[Chemical Formula 1d]

Synthesis Example 5

A polymer including a structural unit represented by Chemical Formula 1e (Mw: 3,100) was obtained through the same synthesis as Synthesis Example 1 by using 41 g of 5,5'-(9H-fluorene-9,9-diyl)dibenzene-1,2,3-triol, 47 g of 4,4'-oxybis((methoxymethyl)benzene), 133 g of propylene glycol monomethyl ether acetate (PGMEA), and 0.5 g of diethylsulfate.

[Chemical Formula 1e]

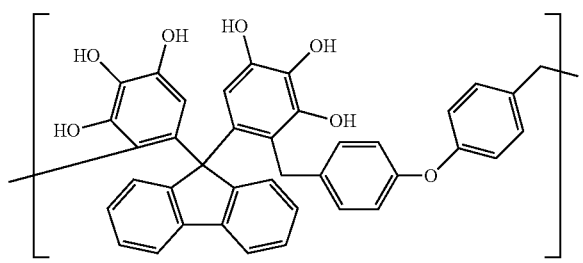

Synthesis Example 6

A polymer including a structural unit represented by Chemical Formula 1f (Mw: 3,200) was obtained through the same synthesis as Synthesis Example 1 by using 41 g of 5,5'-(9H-fluorene-9,9-diyl)dibenzene-1,2,3-triol, 36 g of 1,6-bis(4-(methoxymethyl)phenoxy)hexane, 116 g of propylene glycol monomethyl ether acetate (PGMEA), and 0.5 g of diethylsulfate.

[Chemical Formula 1f]

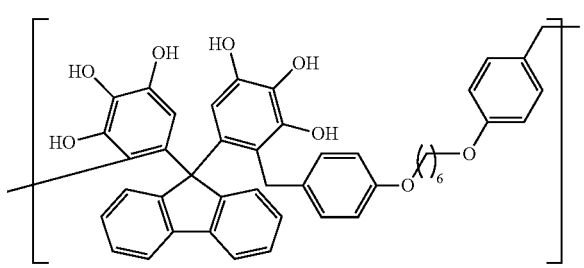

Synthesis Example 7

A polymer including a structural unit represented by Chemical Formula 1 g (Mw: 3,000) was obtained through the same synthesis as Synthesis Example 1 by using 20 g of 5,5'-(9H-fluorene-9,9-diyl)dibenzene-1,2,3-triol, 17 g of 1,3-bis(methoxymethyl)benzene, 7 g of 1H-indol-5-ol, 103 g of propylene glycol monomethyl ether acetate (PGMEA), and 0.5 g of diethylsulfate.

[Chemical Formula 1g]

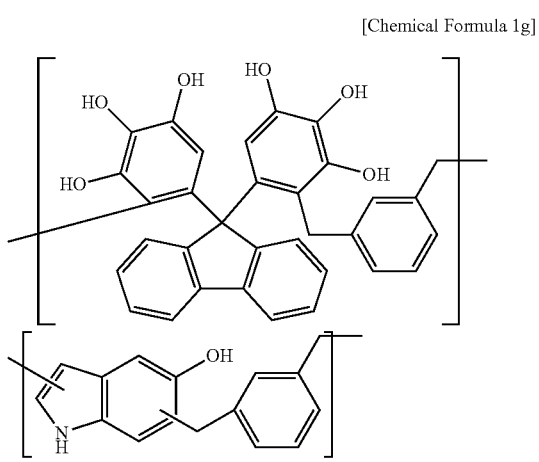

Synthesis Example 8

A polymer including a structural unit represented by Chemical Formula 1h (Mw: 3,500) was obtained through the same synthesis as Synthesis Example 1 by using 20 g of 5,5'-(9H-fluorene-9,9-diyl)dibenzene-1,2,3-triol, 26 g of 4,4'-oxybis((methoxymethyl)benzene), 6 g of 1H-indol, 123 g of propylene glycol monomethyl ether acetate (PGMEA), and 0.5 g of diethylsulfate.

[Chemical Formula 1h]

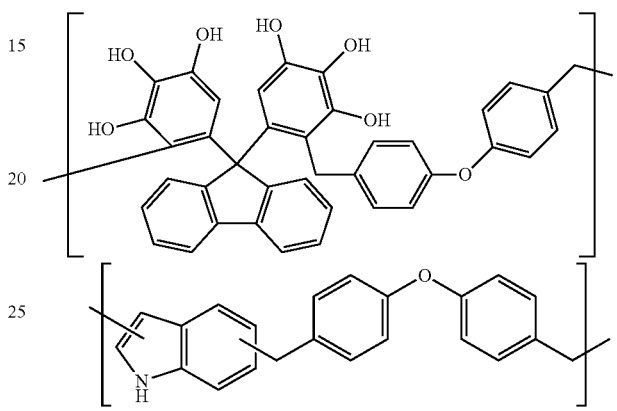

Synthesis Example 9

A polymer including a structural unit represented by Chemical Formula 1i (Mw: 3,500) was obtained through the same synthesis as Synthesis Example 1 by using 48 g of 6,6'-(9H-fluorene-9,9-diyl)dinaphthalene-1,2-diol, 12 g of 4-hydroxybenzaldehyde, 141 g of propylene glycol monomethyl ether acetate (PGMEA), and 0.3 g of diethylsulfate.

[Chemical Formula 1i]

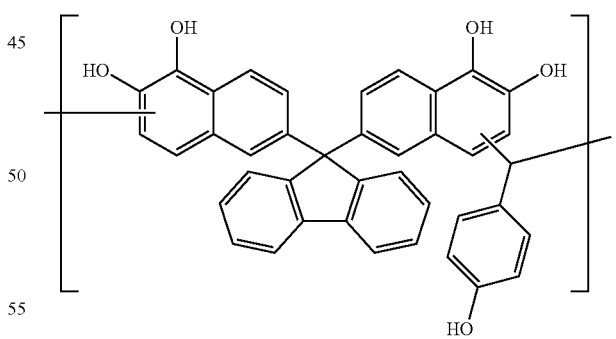

Synthesis Example 10

A polymer including a structural unit represented by Chemical Formula 1 j (Mw: 3,200) was obtained through the same synthesis as Synthesis Example 1 by using 38 g of 4,4'-(9H-fluorene-9,9-diyl)dibenzene-1,2-diol, 17 g of 4-hydroxy-1-naphthaldehyde, 129 g of propylene glycol monomethyl ether acetate (PGMEA), and 0.3 g of diethylsulfate.

[Chemical Formula 1j]

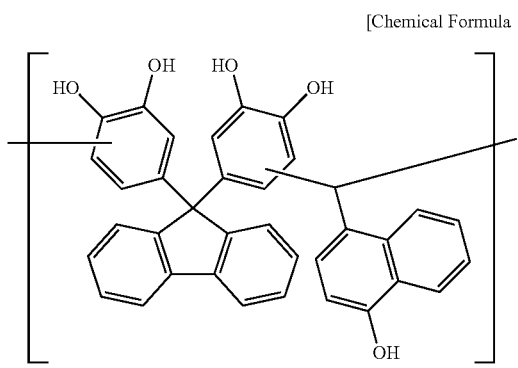

Synthesis Example 11

A polymer including a structural unit represented by Chemical Formula 1k (Mw: 3,000) was obtained through the same synthesis as Synthesis Example 1 by using 19 g of 4,4'-(9H-fluorene-9,9-diyl)dibenzene-1,2-diol, 17 g of 2-hydroxy-1-naphthaldehyde, 7 g of naphthalen-1-ol, 91 g of propylene glycol monomethyl ether acetate (PGMEA), and 0.3 g of p-toluene sulfonic acid hydrate.

[Chemical Formula 1k]

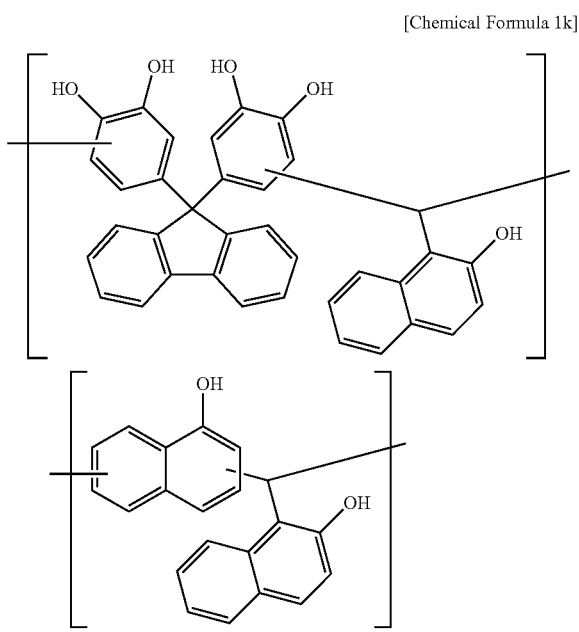

Synthesis Example 12

A polymer including a structural unit represented by Chemical Formula 1l (Mw: 3,100) was obtained through the same synthesis as Synthesis Example 1 by using 19 g of 4,4'-(9H-fluorene-9,9-diyl)dibenzene-1,2-diol, 26 g of 4,4'-oxybis((methoxymethyl)benzene), 7 g of naphthalen-2-ol, 122 g of propylene glycol monomethyl ether acetate (PGMEA), and 0.5 g of diethylsulfate.

[Chemical Formula 1l]

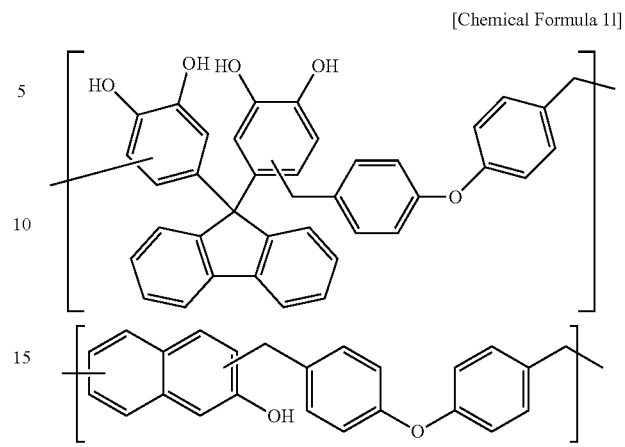

Comparative Synthesis Example 1

23 g of benzoperylene, 17 g of 1,4-bis(methoxymethyl)benzene, 60 g of propylene glycol monomethyl ether acetate (PGMEA), and 1.23 g of diethylsulfate were stirred at 100° C. for 2 to 24 hours to perform a polymerization reaction. When a weight average molecular weight reached a range of 2,000 to 3,500, the reaction was terminated. When the polymerization reaction was complete, the reactant was slowly cooled down to ambient temperature, added to 40 g of distilled water and 400 g of methanol, and the mixture was strongly stirred and allowed to stand. After removing a supernatant therefrom, a precipitate therein was dissolved in 80 g of cyclohexanone, and the solution was strongly stirred by using 320 g of methanol and then, allowed to stand (primary). Herein, after removing a supernatant obtained therefrom again, a precipitate therein was dissolved in 80 g of cyclohexanone (secondary). A polymer including a structural unit represented by Chemical Formula X was obtained through the same synthesis as Synthesis Example 1 (Mw: 2,700).

[Chemical Formula X]

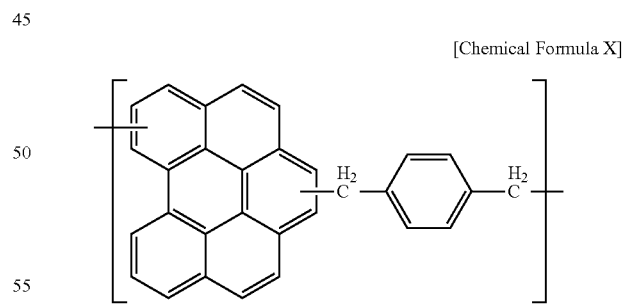

Comparative Synthesis Example 2

A polymer represented by Chemical Formula Y through the same synthesis as Synthesis Example 1 (Mw: 3,500) was obtained by using 45 g of 6,6'-(9H-fluorene-9,9-diyl)dinaphthalen-2-ol, 17 g of 1,4-bis(methoxymethyl)benzene, 62 g of propylene glycol monomethyl ether acetate (PGMEA), and 0.6 g of diethylsulfate.

[Chemical Formula Y]

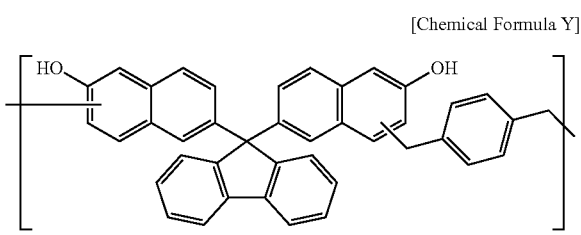

Preparation of Hardmask Composition

Example 1

The polymer according to Synthesis Example 1 was dissolved in a mixed solvent of propylene glycol monomethyl ether acetate (PGMEA) and cyclohexanone (7:3 (v/v)), and the solution was filtered to prepare a hardmask composition. The polymer compound was included in an amount of 1 to 20 wt % based on the total weight of the hardmask composition depending on a desired thickness.

Examples 2 to 12

Each hardmask composition was prepared according to the same method as Example 1 except for respectively using the polymers of Synthesis Examples 2 to 12 instead of the polymer of Synthesis Example 1.

Comparative Examples 1 and 2

A hardmask composition was prepared according to the same method as Example 1 except for respectively using the polymers according to Comparative Synthesis Examples 1 and 2 instead of the polymer according to Synthesis Example 1.

Evaluation of Gap-Fill Characteristics

Each hardmask composition according to Examples 1 to 12 and Comparative Examples 1 and 2 was spin-on coated on a silicon wafer having a hole pattern to form a thin film, and the cross section of the thin film was examined by using a V-SEM equipment. The content of a compound in the hardmask compositions was adjusted to form a 2,000 Å-thick film on a bare wafer.

The results are shown in Table 1.

TABLE 1

|  | Gap-fill characteristics |
|---|---|
| Example 1 | No void |
| Example 2 | No void |
| Example 3 | No void |
| Example 4 | No void |
| Example 5 | No void |
| Example 6 | No void |
| Example 7 | No void |
| Example 8 | No void |
| Example 9 | No void |
| Example 10 | No void |
| Example 11 | No void |
| Example 12 | No void |
| Comparative Example 1 | Void |
| Comparative Example 2 | Void |

Referring to Table 1, each thin film respectively formed of the hardmask compositions according to Examples 1 to 12 showed no void and thus excellent gap-fill characteristics.

Evaluation of Planarization Characteristics

Each hardmask composition according to Examples 1 to 5, 7, 8, 11, and 12 and Comparative Examples 1 and 2 was spin-on coated on a silicon wafer having a hole pattern and baked at 400° C. to respectively form thin films, and the cross sections of the thin films were examined by using a V-SEM equipment. The content of a compound in the hardmask compositions was adjusted to form a 1,400 Å-thick film on a bare wafer.

The planarization characteristics were evaluated by measuring a thickness difference of a resist underlayer in a region having a hole and a region having no hole. The planarization characteristics were digitized according to Calculation Equation 1 of FIG. 1. As the film thickness difference of the regions having a pattern and no pattern is smaller, e.g., as the digitized value is smaller, the planarization characteristics are improved.

The results are shown in Table 2.

TABLE 2

|  | Planarization characteristics |
|---|---|
| Example 1 | 26 nm |
| Example 2 | 28 nm |
| Example 3 | 23 nm |
| Example 4 | 18 nm |
| Example 5 | 19 nm |
| Example 7 | 24 nm |
| Example 8 | 26 nm |
| Example 11 | 25 nm |
| Example 12 | 19 nm |
| Comparative Example 1 | 42 nm |
| Comparative Example 2 | 39 nm |

Referring to Table 2, the thin films respectively formed from the hardmask compositions according to Examples 1 to 5, 7, 8, 11, and 12 and Comparative Examples 1 and 2 exhibited excellent planarization compared with the thin films respectively formed from the hardmask compositions according to Comparative Examples 1 and 2.

By way of summation and review, a hardmask layer plays a role of an interlayer transferring the fine pattern of the photoresist to a material layer through a selective etching process. Accordingly, the hardmask layer may exhibit characteristics such as etch resistance, and the like to endure multi-etching processes. A spin-on coating method, instead of a chemical vapor deposition (CVD) method, has recently been considered to form the hardmask layer. Heat resistance and etch resistance may have trade-off relationship with spin-on characteristics, and an organic layer material may satisfy all the characteristics.

The embodiments may provide a polymer having satisfactory heat resistance and etch resistance while ensuring solubility in a solvent, gap-fill characteristics, and planarization characteristics.

The polymer may have satisfactory solubility characteristics as well as excellent mechanical characteristics, etch resistance, and heat resistance and thus may be applicable in a spin-on coating method.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A polymer comprising a structural unit represented by Chemical Formula 1:

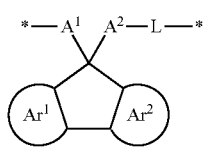

[Chemical Formula 1]

wherein, in Chemical Formula 1,
$Ar^1$ and $Ar^2$ are each independently a substituted or unsubstituted benzene ring or an aromatic ring including two to four fused substituted or unsubstituted benzene rings,
$A^1$ and $A^2$ are each independently a substituted or unsubstituted aromatic ring, provided that:
   at least one of $A^1$ and $A^2$ is substituted with a hydrogen-bondable functional group, the hydrogen-bondable functional group being a hydroxy group, an amine group, or a combination thereof, and
   a sum of a number of the hydrogen-bondable functional group of $A^1$ and a number of the hydrogen-bondable functional group of $A^2$ is greater than or equal to 3,
L is a divalent organic group, and
* is a linking point.

2. The polymer as claimed in claim 1, wherein $A^1$ and $A^2$ each independently include a substituted or unsubstituted one of the following moieties:

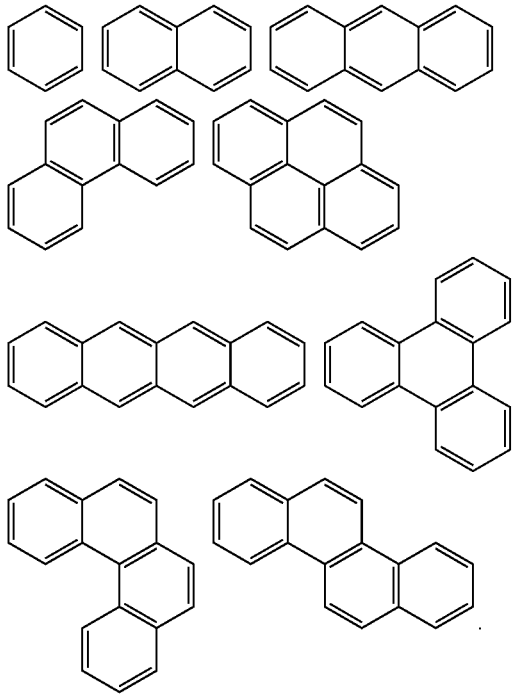

3. The polymer as claimed in claim 1, wherein L is represented by one of Chemical Formulae Z1 to Z4:

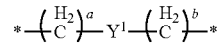

[Chemical Formula Z1]

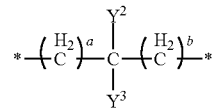

[Chemical Formula Z2]

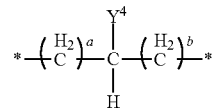

[Chemical Formula Z3]

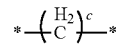

[Chemical Formula Z4]

wherein, in Chemical Formulae Z1 to Z4,
a and b are each independently 0 or 1,
c is an integer of 1 to 5,
* is a linking point, and
$Y^1$ to $Y^4$ each independently include a substituted or unsubstituted one of the following moieties:

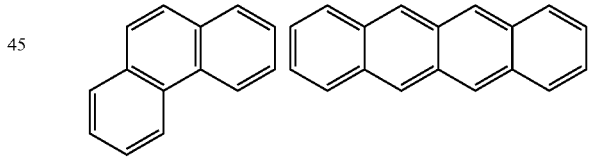

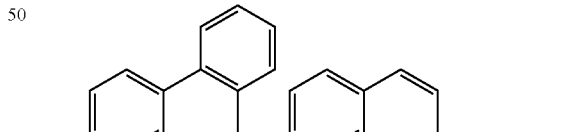

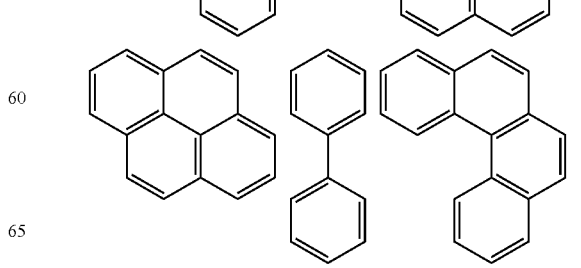

-continued

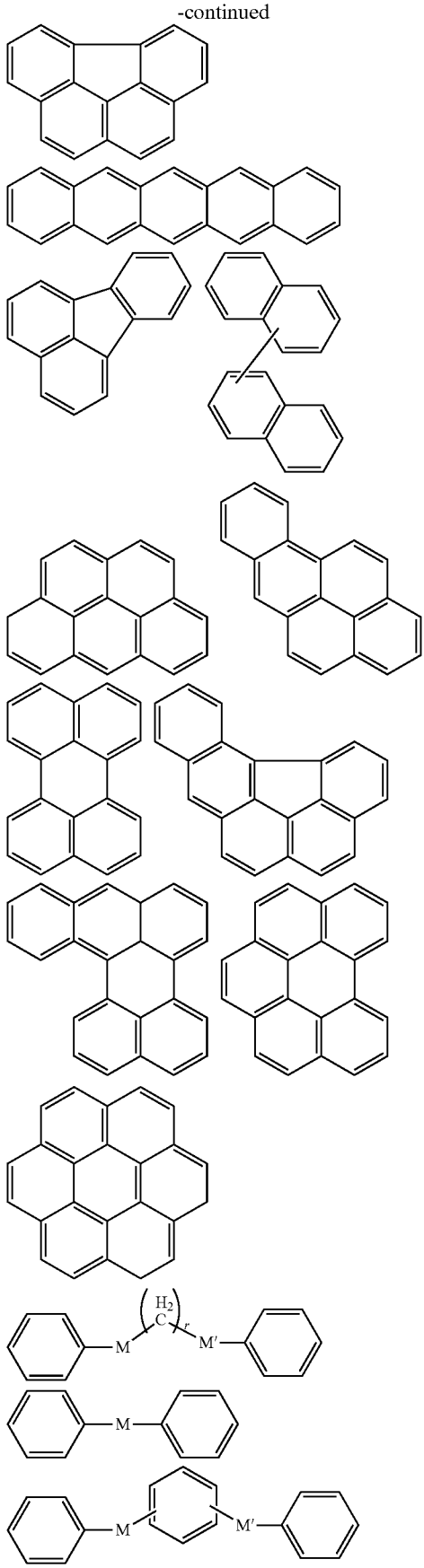

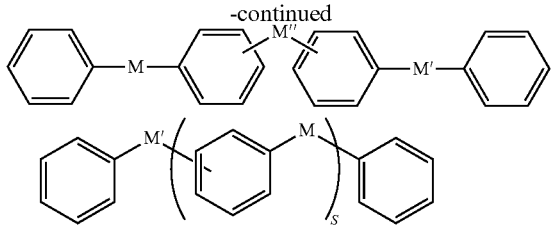

wherein, in the above moieties,

M, M', and M" are each independently a substituted or unsubstituted C1 to C10 alkylene group, O, S, $SO_2$, $CR^aR^b$, $NR^d$, or carbonyl, in which $R^a$, $R^b$, and $R^d$ are each independently hydrogen, a substituted or unsubstituted C1 to C10 alkyl group, a substituted or unsubstituted C6 to C30 aryl group, a halogen atom, a halogen-containing group, or a combination thereof, r is an integer of 0 to 10, and s is an integer of 3 to 10.

4. The polymer as claimed in claim 1, wherein the sum of the number of the hydrogen-bondable functional group of $A^1$ and the number of the hydrogen-bondable functional group of $A^2$ is 3, 4, 5, or 6.

5. The polymer as claimed in claim 1, wherein the structural unit represented by Chemical Formula 1 is represented by one of Chemical Formulae 1-1 and 1-2:

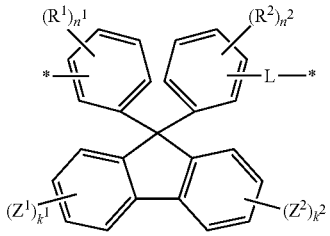

[Chemical Formula 1-1]

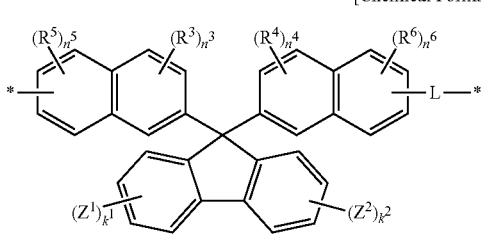

[Chemical Formula 1-2]

wherein, in Chemical Formulae 1-1 and 1-2, $R^1$ to $R^6$ are each independently the hydroxy group, the amine group, or the combination thereof, $n^1$ to $n^6$ are each independently an integer of 0 to 3, a sum of $n^1$ and $n^2$ and a sum of $n^3$ to $n^6$ each independently being greater than or equal to 3, $Z^1$ and $Z^2$ are each independently a hydroxy group, a methoxy group, an ethoxy group, a halogen, a substituted or unsubstituted C1 to C30 alkyl group, a substituted or unsubstituted C6 to C30 aryl group, a substituted or unsubstituted C1 to C30 alkoxy group, or a combination thereof, $k^1$ and $k^2$ are independently an integer of 0 to 4, L is a divalent organic group, and

* is a linking point.

6. The polymer as claimed in claim 1, wherein the polymer further includes a structural unit represented by Chemical Formula 2:

*-X-L-* [Chemical Formula 2]

wherein, in Chemical Formula 2,

X is an aromatic ring group substituted with at least one hydrogen-bondable functional group or a heteroaromatic ring group substituted with at least one hydrogen-bondable functional group, L is a divalent organic group, and

* is a linking point.

7. The polymer as claimed in claim 6, wherein the hydrogen-bondable functional group of X is a hydroxy group, an amine group, or a combination thereof.

8. The polymer as claimed in claim 1, wherein the polymer has a weight average molecular weight of about 500 to about 200,000.

9. An organic layer composition, comprising:
   a solvent; and
   a polymer including a structural unit represented by Chemical Formula 1,

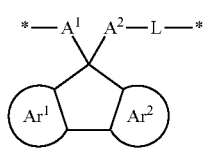
[Chemical Formula 1]

wherein, in Chemical Formula 1, $Ar^1$ and $Ar^2$ are each independently a substituted or unsubstituted benzene ring or an aromatic ring including two to four fused substituted or unsubstituted benzene rings, $A^1$ and $A^2$ are each independently a substituted or unsubstituted aromatic ring, provided that:

at least one of $A^1$ and $A^2$ is substituted with a hydrogen-bondable functional group, the hydrogen-bondable functional group being a hydroxy group, an amine group, or a combination thereof, and a sum of a number of the hydrogen-bondable functional group of $A^1$ and a number of the hydrogen-bondable functional group of $A^2$ is greater than or equal to 3, L is a divalent organic group, and

* is a linking point.

10. The organic layer composition as claimed in claim 9, wherein $A^1$ and $A^2$ each independently include a substituted or unsubstituted one of the following moieties:

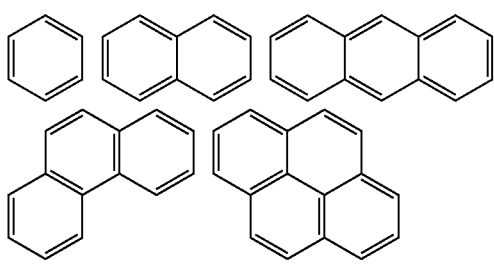

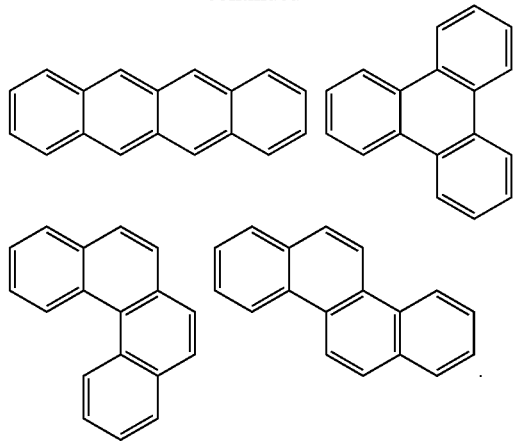

11. The organic layer composition as claimed in claim 9, wherein L is represented by one of Chemical Formulae Z1 to Z4:

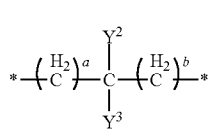
[Chemical Formula Z1]

[Chemical Formula Z2]

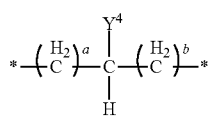
[Chemical Formula Z3]

[Chemical Formula Z4]

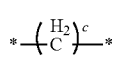

wherein, in Chemical Formulae Z1 to Z4, a and b are each independently 0 or 1, c is an integer of 1 to 5,

* is a linking point, and $Y^1$ to $Y^4$ each independently include a substituted or unsubstituted one of the following moieties:

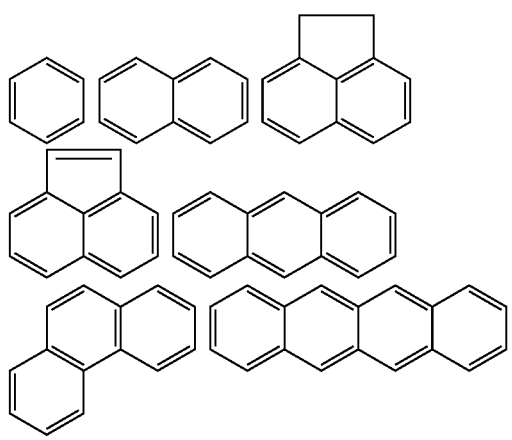

-continued

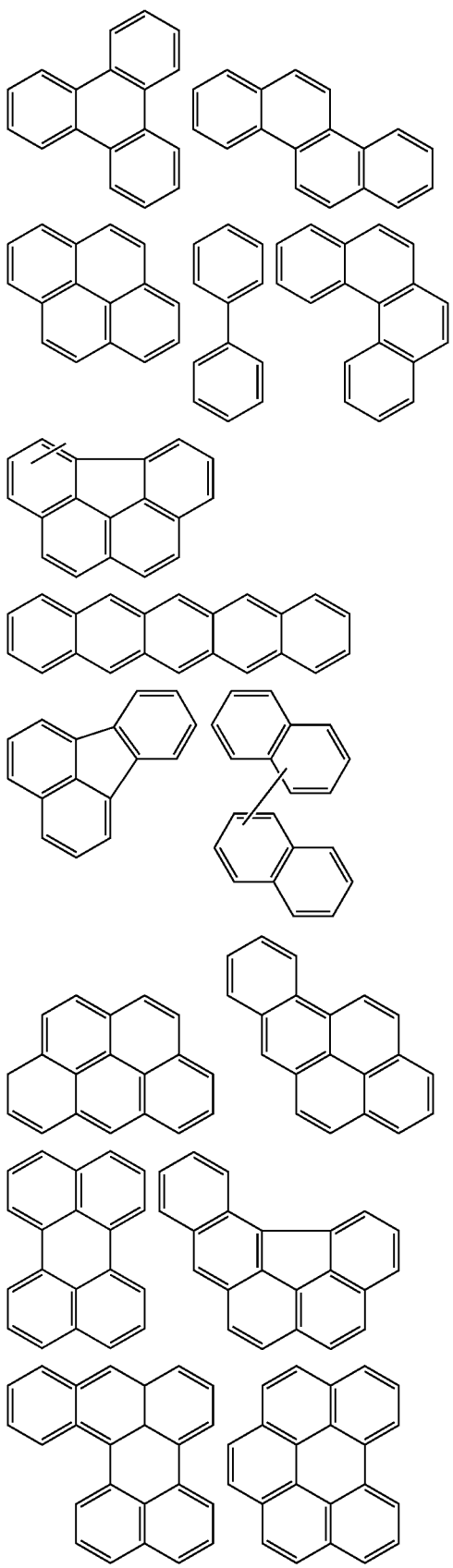

-continued

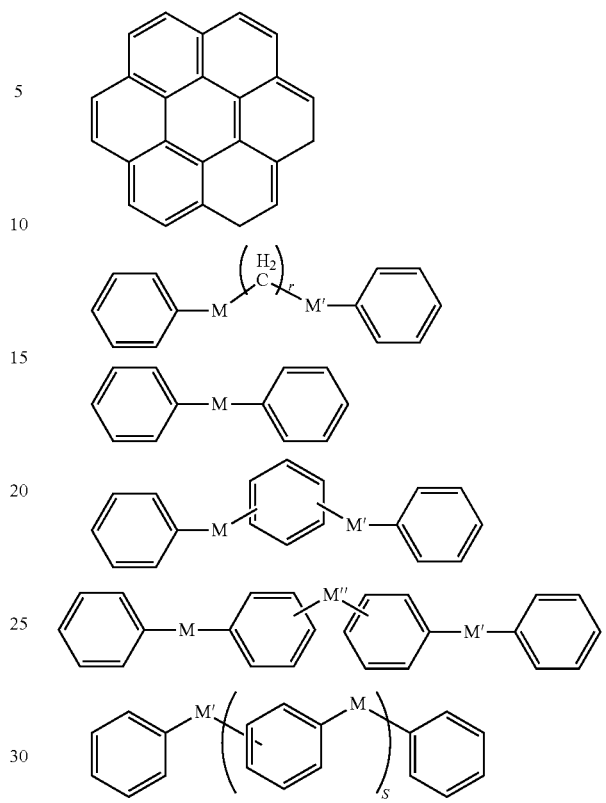

wherein, in the above moieties,

M, M', and M'' are each independently a substituted or unsubstituted C1 to C10 alkylene group, O, S, $SO_2$, $CR^aR^b$, $NR^d$, or carbonyl, in which $R^a$, $R^b$, and $R^d$ are each independently hydrogen, a substituted or unsubstituted C1 to C10 alkyl group, a substituted or unsubstituted C6 to C30 aryl group, a halogen atom, a halogen-containing group, or a combination thereof, r is an integer of 0 to 10, and s is an integer of 3 to 10.

12. The organic layer composition as claimed in claim 9, the sum of the number of the hydrogen-bondable functional group of $A^1$ and the number of the hydrogen-bondable functional group of $A^2$ is 3, 4, 5, or 6.

13. The organic layer composition as claimed in claim 9, wherein the structural unit represented by Chemical Formula 1 is represented by one of Chemical Formulae 1-1 and 1-2:

[Chemical Formula 1-1]

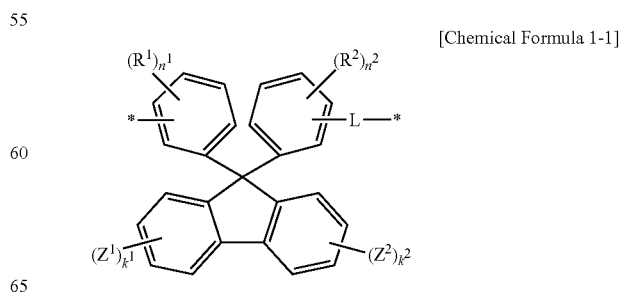

[Chemical Formula 1-2]

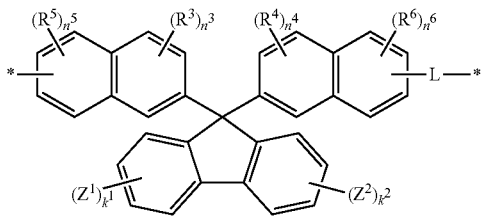

wherein, in Chemical Formulae 1-1 and 1-2,
$R^1$ to $R^6$ are independently the hydroxy group, the amine group, or the combination thereof,
$n^1$ to $n^6$ are independently an integer of 0 to 3, a sum of $n^1$ and $n^2$ and a sum of $n^3$ to $n^6$ each independently being greater than or equal to 3,
$Z^1$ and $Z^2$ are independently hydroxy group, methoxy group, ethoxy group, a halogen, a substituted or unsubstituted C1 to C30 alkyl group, a substituted or unsubstituted C6 to C30 aryl group, a substituted or unsubstituted C1 to C30 alkoxy group, or a combination thereof,
$k^1$ and $k^2$ are independently an integer of 0 to 4,
L is a divalent organic group, and
* is a linking point.

14. The organic layer composition as claimed in claim 9, wherein the polymer further includes a structural unit represented by Chemical Formula 2:

*-X-L-*            [Chemical Formula 2]

wherein, in Chemical Formula 2,
X is an aromatic ring group substituted with at least one hydrogen-bondable functional group or a heteroaromatic ring group substituted with at least one hydrogen-bondable functional group,
L is a divalent organic group, and
* is a linking point.

15. The organic layer composition as claimed in claim 14, wherein the hydrogen-bondable functional group of X is a hydroxy group, an amine group, or combination thereof.

16. The organic layer composition as claimed in claim 9, wherein the polymer has a weight average molecular weight of about 500 to about 200,000.

17. A method of forming patterns, the method comprising:
providing a material layer on a substrate,
applying the organic layer composition as claimed in claim 10 on the material layer,
heat-treating the organic layer composition to provide a hardmask layer,
providing a silicon-containing thin layer on the hardmask layer,
providing a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

18. The method as claimed in claim 17, wherein applying the organic layer composition includes performing a spin-on coating method.

* * * * *